United States Patent
Hoene et al.

(10) Patent No.: US 11,210,998 B2
(45) Date of Patent: Dec. 28, 2021

(54) TRANSPARENT DISPLAY DEVICE

(71) Applicant: SYMONICS GMBH, Dusslingen (DE)

(72) Inventors: Christian Hoene, Dusslingen (DE); Herve Loridan, Bonn (DE)

(73) Assignee: Symonics GmbH, Dusslingen (DE)

(*) Notice: Subject to any disclaimer, the term of this patent is extended or adjusted under 35 U.S.C. 154(b) by 0 days.

(21) Appl. No.: 17/042,279

(22) PCT Filed: Mar. 26, 2019

(86) PCT No.: PCT/EP2019/057590
§ 371 (c)(1),
(2) Date: Sep. 28, 2020

(87) PCT Pub. No.: WO2019/185629
PCT Pub. Date: Oct. 3, 2019

(65) Prior Publication Data
US 2021/0142717 A1    May 13, 2021

(30) Foreign Application Priority Data

Mar. 27, 2018 (DE) ..................... 10 2018 107 309.7

(51) Int. Cl.
*G09G 3/32* (2016.01)
*H01L 25/16* (2006.01)
(Continued)

(52) U.S. Cl.
CPC .............. *G09G 3/32* (2013.01); *H01L 25/16* (2013.01); *H01L 33/36* (2013.01); *H05B 33/00* (2013.01); *G09G 2330/021* (2013.01)

(58) Field of Classification Search
CPC .... F21K 9/00; G09G 3/32; G09F 9/33; H01L 25/075; H01L 25/0753
See application file for complete search history.

(56) References Cited

U.S. PATENT DOCUMENTS

2006/0125410 A1* 6/2006 Duggal ............... H01L 27/3204
                                                              315/169.3
2010/0188005 A1* 7/2010 Van Herpen ...... B32B 17/10036
                                                              315/210
(Continued)

FOREIGN PATENT DOCUMENTS

DE   102004039897 A1   3/2006
EP       1895545 A2   3/2008
(Continued)

OTHER PUBLICATIONS

International Search Report for PCT/EP2019/057590 Prepared by the European Patent Office, dated Jun. 7, 2019, 8 pages including English translation.

*Primary Examiner* — Mariceli Santiago
(74) *Attorney, Agent, or Firm* — Brooks Kushman P.C.

(57) ABSTRACT

A display device having a partially transparent substrate with a plurality of electrical consumers arranged in series having first and second contacts for applying a first and a second potential, and a third contact for receiving a control signal. A partially transparent electrically conductive layer electrically contacts the electrical consumers. A first and second connector for applying the first and the second potential to the conductive layer, and a third connector for applying the control signal. The conductive layer is attached to the transparent substrate with the three segments insulated from one another. A first and second segment are distanced from one another by a third segment. The first segment contacts the first connector and the first contact of one or more consumers, and the second segment contacts the second connector and the second contact of a consumers. The third segment contacts a third contact of an electrical consumer.

19 Claims, 7 Drawing Sheets

Figure 1:
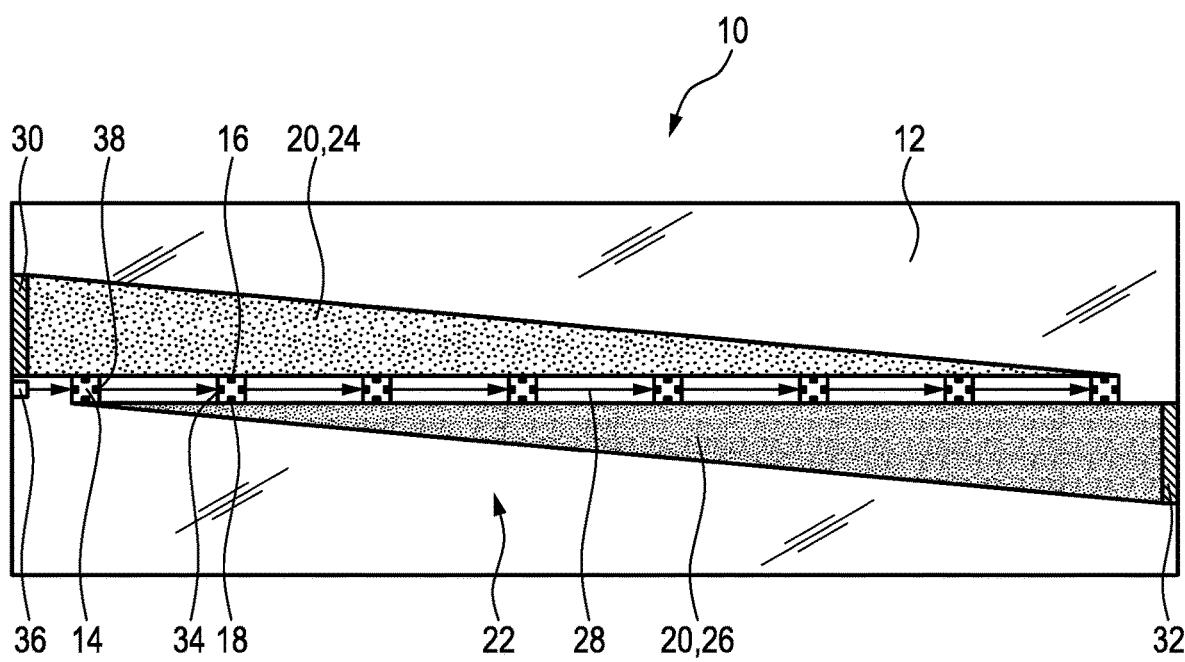

(51) Int. Cl.
*H01L 33/36* (2010.01)
*H05B 33/00* (2006.01)

(56) References Cited

U.S. PATENT DOCUMENTS

2010/0244695 A1\* 9/2010 Van Herpen .............. F21K 9/00
 315/51
2010/0275477 A1\* 11/2010 Kim .......................... G09F 9/33
 40/541

FOREIGN PATENT DOCUMENTS

| EP | 2879120 A1 | | 6/2015 | |
|----|------------|---|--------|---|
| KR | 20080098245 A | \* | 11/2008 | ............... G09F 9/33 |
| WO | 0182378 A1 | | 11/2001 | |
| WO | WO-0182378 A1 | \* | 11/2001 | ............... G09F 9/33 |
| WO | WO-2008074800 A1 | \* | 6/2008 | ....... B32B 17/10036 |
| WO | WO-2008136589 A2 | \* | 11/2008 | ............... G09F 9/33 |
| WO | 2009003525 A1 | | 1/2009 | |
| WO | WO-2010088961 A1 | \* | 8/2010 | ....... B32B 17/10541 |
| WO | 2011101354 A1 | | 8/2011 | |
| WO | WO-2011101354 A1 | \* | 8/2011 | ....... B32B 17/10541 |

\* cited by examiner

TRANSPARENT DISPLAY DEVICE

CROSS-REFERENCE TO RELATED APPLICATION

This application is the U.S. national phase of PCT Application No. PCT/EP2019/057590 filed on Mar. 26, 2019, which claims priority to DE Patent Application No. 10 2018 107 309.7 filed on Mar. 27, 2018, the disclosures of which are incorporated in their entirety by reference herein.

The present invention relates to a display device comprising an at least partly transparent substrate and a plurality of electrical consumers arranged in series.

Such a display device is used for example for an illuminated window or an illuminated facade or as a display for images and films. For this purpose, the electrical consumers are generally light emitting diodes (LEDs) which are distributed over the transparent substrate and can preferably be driven individually. One example of such a device is shown in EP 2 879 120 A1.

In EP 2 879 120 A1, each LED is driven via a specific feed line and a plurality of signals are routed out at the transparent substrate. The electrical connection technology is correspondingly complex and requires a complex plug connection, which can be problematic particularly for the glazier when installing the windows. Such a plug connection is generally very sensitive and is easily damaged during mounting.

WO 2009/003525 A1 discloses how LEDs on a glass pane with a transparent and electrically conductive coating can be driven, such that all the LEDs are supplied with power and two metallic feed lines provide energy with little power loss only at one side. In WO 2009/003525 A1, however, all the LEDs are driven identically.

WO 2011/101354 A1 discloses how, on a coated glass pane, the LEDs can be driven such that loss resistances at the feed line are minimized. In accordance with WO 2011/101354 A1, as in the case of EP 2 879 120 A1 cited in the introduction, the LEDs are however still driven by a plurality of individual lines, with the result that the problem of the plurality of individual feed lines for the individual LEDs still remains.

DE 10 2004 039897 A1 discloses, in an alternative method, distributing the feed lines between an upper and a lower glass pane, as a result of which the number of terminals on a substrate can be halved.

Against this background, it is an object of the present invention to specify a display device of the type mentioned in the introduction in which the electrical consumers can be driven individually and at the same time only a small number of feed lines are required in order to avoid a complicated and error-prone electrical connection. At the same time, the display is intended to be able to be operated at a low operating voltage in order that no special protection and insulation measures are necessary. In addition, the intention is to enable the display device to be produced as cost-effectively as possible.

The object is achieved by means of a display device, comprising: an at least partially transparent substrate, a plurality of electrical consumers arranged in series, wherein each consumer has a first contact and a second contact for applying a first potential and a second potential and a third contact for receiving a control signal, a partly transparent, electrically conductive layer for electrically contacting the plurality of electrical consumers, a first terminal and a second terminal for applying the first and second potentials to the electrically conductive layer and also a third terminal for applying the control signal to the electrically conductive layer, wherein the electrically conductive layer is applied in a defined pattern to the at least partly transparent substrate, which has at least three segments insulated from one another, wherein a first segment and a second segment are spaced apart from one another by a third segment, where the first segment contacts the first terminal and the first contact of one or more consumers of the plurality of consumers, the second segment contacts the second terminal and the second contact of one or more consumers of the plurality of electrical consumers, and the third segment contacts at least the third contact of an electrical consumer of the plurality of electrical consumers.

A concept of the present invention, therefore, is to provide a transparent substrate, e.g. a glass sheet or a laminated glass element, with a plurality of electrical consumers, in particular illuminants. The electrical consumers are electrically contactable by means of an electrically conductive and partly transparent coating applied on the transparent substrate. In this context, partly transparent means that the coating is transparent to the extent of at least 50%, in particular between 70% and 90%, i.e. transmits to the extent of this percentage electromagnetic radiation in a spectral range visible to humans.

The coating is specially structured and comprises a plurality of segments insulated from one another. Firstly a supply voltage and secondly a control signal are fed to the electrical consumers via the insulated segments. Consequently, the display device manages just with three external terminals.

An electrically conductive and transparent layer taken into consideration here typically has a sheet resistance of approximately 5 ohms/□. The sheet resistance (resistivity) describes the electrical resistance of an electrically conductive layer having such a small thickness that electric current flows through it only parallel to the layer, i.e. the current enters at one end face and exits again at the opposite end face. A sheet resistance of approximately 5 ohms/□ corresponds approximately to ten thousand times the sheet resistance of a copper coating of a printed circuit board, approximately 0.5 mΩ/□.

The segmentation in the defined pattern is configured to take account of the high sheet resistance during the supply of the electrical consumers. This is achieved by means of an area of the first and second segments which is as large as possible, wherein the segments are approximately of identical size and preferably symmetrical, such that a voltage drop across the segments from the connected potentials to the first and second contacts of the electrical consumers is identical.

The third segment corresponds to a data line via which control signals can be transmitted to the electrical consumers. The control signal is preferably a digital signal, which comprises a delimited and stepped value range and, in terms of the temporal sequence, is defined or has a change in the signal value only at specific periodic points in time. Compared with analog control signals, a digital signal is less susceptible to line losses or there is the possibility of compensating for these losses by means of suitable signal processing steps. Consequently, compared with the first and second segments, the third segment can be embodied as very small and as a conductor track. The conductor track width can correspond approximately to the conductor track width of a conductor track of a copper-coated printed circuit board.

In the case of the display device according to the invention, the electrical consumers are thus contacted preferably exclusively via the electrically conductive layer, wherein the supply voltage is transmitted via two segments having as far as possible identical areas and a control signal is fed to the electrical consumer via a third segment similar to a conductor track. The display device thus requires only three external terminals. All the feed lines are partly transparent and can be applied on the transparent substrate in one work operation. Overall, therefore, simple and cost-effective production of a display device with a plurality of electrical consumers on a transparent substrate is possible. The object mentioned in the introduction is thus achieved in its entirety.

In one preferred configuration, the first and second segments substantially can comprise an area of identical size and be embodied symmetrically.

In a further configuration, the first segment can contact the first terminal and the first contact of at least two consumers of the plurality of consumers and the second segment (26) can contact the second terminal and the second contact of at least two further consumers of the plurality of electrical consumers, wherein in each case a first consumer of the at least two consumers and a first consumer of the at least two further consumers define a first group, within which the first consumers are connected in series, and wherein a second consumer of the at least two consumers and a second consumer of the at least two further consumers define a second group, within which the second consumers are connected in series.

In a further configuration, the third segment between the plurality of consumers can be subdivided into further segments and a series connection of the respective first consumers and the second consumers can be formed via these further segments.

In a further configuration, the first group can have a further third consumer, which is connected in series with the first consumers of the first group, and the second group can have a further third consumer, which is connected in series with the second consumers of the second group.

In a further configuration, the first segment can contact the first terminal and the first contact of all consumers of the plurality of consumers and the second segment can contact the second terminal and the second contact of all consumers of the plurality of electrical consumers.

In a further configuration, the first segment comprises for each electrical consumer in each case an electrically conductive first connection of the respective first contact to the first potential and the second segment comprises for each electrical consumer in each case an electrically conductive second connection of the respective second contact to the second potential.

In this configuration, it is possible to define individual connections between the contacts at the electrical consumers and the potentials. In this case, a connection is an electrical contact between the potential and the contact at the electrical consumer. The connections are not necessarily insulated from one another, but rather determined by the respective electrical properties between the contact at the consumer and the terminal of the potentials. In this regard, contacts of two consumers can be contacted with a potential via the same segment, but define different connections, since one contact is e.g. closer to the terminal of the potential than another contact. The defined pattern accordingly affects the connections by virtue of it influencing the electrical properties. Different connections can thus be defined by way of the defined pattern, as a result of which, in particular, the different spatial position of the electrical consumers with respect to the terminals of the potentials can advantageously be compensated for.

In one preferred configuration in this respect, each of the first and second electrically conductive connections has in each case a defined sheet resistance relative to the electrically conductive layer, and the defined pattern is embodied such that a ratio of the sheet resistances of the respective first and second connections of each electrical consumer is of identical magnitude in a defined tolerance range for the plurality of electrical consumers arranged in series.

In this configuration, the pattern is designed such that the sheet resistances of the connections are in a defined ratio. If the electrical consumers are arranged horizontally in series, for example, one pole of the power supply can be fed in from one side, and the other pole from the other side. By means of the defined pattern, the sheet resistances of the connection can be fashioned such that the voltage drop of "negative" and "positive" advantageously mutually compensates for one another. In this regard, in the case of LEDs as electrical consumers, for example, a left LED has a low voltage drop at the pole fed in from the left—but a high voltage drop at the pole fed in from the right. The opposite applies to the right LED. This is particularly advantageous if the sheet resistances of the first and second connections of a respective consumer are different predominantly on account of the position of the electrical consumers with respect to the potential terminals.

In a further configuration, the third segment forms a conductor line, which connects the electrical consumers preferably in series with one another.

In this configuration, the electrical consumers are connected to one another by the third segment. Preferably, in this case, the electrical consumers are strung together like on a string of beads and connected in each case to the third segment. The third segment can thus also be divided into sections divided by the consumers. The third segment or its individual sections together with the electrical consumers thus preferably form a bus, via which the control signals are transmitted serially to the electrical consumers. In this way, the electrical consumers can be driven in a particularly simple manner and just with one external terminal.

In one preferred configuration in this respect, the plurality of electrical consumers are configured to modify the control signal in each case. Modify means, inter alia, that the individual electrical consumers can amplify the control signal in each case before it is forwarded to the next consumer.

In a further preferred configuration, the conductor line has at least one capacitor in series, in particular a capacitor upstream of each individual electrical consumer of the plurality of electrical consumers.

On account of the feed line resistances when feeding in the supply voltage via the electrically conductive layer, and thus primarily also when feeding in the ground potential, the electrical consumers do not all operate at the same voltage potential. This is relevant primarily to the signal powers with which the electrical consumers are coupled to one another via the conductor line. A local level of 0 V at an electrical consumer therefore does not necessarily correspond to the same local level at an adjacent electrical consumer. Rather, the value can be larger or smaller on account of the different ground potential. A capacitor in the signal path upstream of an electrical consumer makes it possible to eliminate these potential differences by virtue of only the regularly changing voltage differences of the signal being passed through. This requires the serial signals not to have a DC component, but rather substantially AC components with correspondingly high frequencies. This can be achieved for example by means of a suitable Manchester coding of the control signal.

In a further configuration, a respective voltage regulator is arranged between the first contact and the second contact.

The current supply of the electrical consumers via the electrically conductive coating is subject to a voltage drop that is linear with respect to the passage of current. An electrical consumer which is switched on naturally requires more current than an electrical consumer which is switched off. Nevertheless, some electrical consumers, such as e.g. smart LEDs, on account of built-in electronics, require a defined voltage level within a fixed range, for example between 3.5 and 5.3 V. This defined voltage level can be realized by means of an individual voltage regulator.

In one preferred configuration in this respect, the voltage regulator is a diode, in particular a zener diode, which is connected in parallel with the first and second contacts.

The voltage regulator can be realized in a particularly simple manner by means of a simple diode. Furthermore, a diode together with the different feed line resistances can provide for a stable voltage supply.

In a further configuration, a constant-current source can be used as voltage regulator. The constant-current source can be the same one that is also used for the driving of the individual LEDs. If the LEDs are switched on, the constant-current source serves for driving the LEDs; if the LEDs are switched off, the LEDs are bridged.

In a further configuration, the transparent substrate is rectangular and the first terminal for applying the first potential extends along a first side of the at least partly transparent substrate and the second terminal for applying the second potential extends along a second side situated opposite the first side.

In this configuration, the terminals for receiving the potentials of the supply voltage extend on opposite sides of the transparent substrate. This is advantageous if a relatively large matrix of consumers extending in rows and columns over the transparent substrate is to be driven. In the case of simple terminals in the first and second segments, exponentially more energy is then lost on account of the feed line resistances of the coating. At the edges, therefore, provision is preferably made of metal conductors as terminal electrodes which serve for feeding in energy. If the nontransparent metal conductor is situated at the edge of the glass pane, it hardly impairs the transparency since the glass pane is transparent only to a limited extent at these points. It goes without saying that the terminal electrode can additionally also run along an adjacent side edge of the mutually opposite sides, such that an external terminal is required only at one location. In this case, the electrode at the adjacent side edge does not contact the electrically conductive layer, however, in order not to reduce the feed line resistances for some consumers to an excessively great extent.

In one preferred configuration in this respect, the series of the plurality of electrical consumers extends from the first side toward the second side, wherein the series defines in particular a straight line that intersects the first and second sides at a right angle.

In this configuration, an optimum pattern of the electrically conductive layer can be determined and implemented particularly easily. By way of example, the pattern can be realized by two intermeshing combs in order to ensure optimum connections between the terminals of the potentials and the individual contacts of the electrical consumers.

In a further configuration, the first segment forms a first closed, triangular area and the second segment forms a second closed, triangular area. This configuration makes it possible, particularly in the case of electrical consumers arranged in series, also to supply the electrical consumers arranged in the center with constant voltage.

In one preferred configuration in this respect, a first side of the first closed, triangular area runs along a side of the at least partly transparent substrate, a first side of the second closed, triangular area runs along a second side of the at least partly transparent substrate, and a second side of the first and second closed, triangular areas in each case runs along the series of the plurality of electrical consumers.

In this configuration, it is possible to realize a particularly preferred defined pattern which enables a matrix arrangement of the electrical consumers which are all connected by a single bus and are optimally supplied with an operating voltage by two intermeshing zigzag combs.

In a further configuration, at least one electrical consumer of the plurality of electrical consumers is a smart LED.

Smart LEDs are illuminants which can typically be connected in series and driven individually via a bus. Each smart LED can display a rich spectrum of colors in an individually controlled manner preferably by means of three colored LEDs. Besides a terminal for receiving the control signal, a smart LED generally has a first and a second contact for applying the required supply voltage and optionally a further output for forwarding the control signal via the bus. One example of a smart LED is the component WS2812B, which uses exactly one line as a data bus.

In a preferred configuration, each consumer of the plurality of electrical consumers has a fourth contact and is configured to loop the control signal through serially from the third contact to the fourth contact.

In this configuration of the electrical consumers, a control can be effected in a particularly simple manner via a serial conductor line, wherein the third segment connects in each case the fourth contact of an electrical consumer to the third contact of an adjacent electrical consumer. Furthermore, the electrical consumer can have a shift register that is arranged between the data input (third contact) and the data output (fourth contact) and always keeps a temporally changing data word of the control signal.

In a further configuration, the first and second segments are embodied as a plurality of spur lines to the first and second contacts of the plurality of electrical consumers.

In this configuration, the first and second segments are embodied such that individual spur lines in the form of strands or bars lead to the contacts. In this case, the first and second segments preferably still form a closed area, wherein the structure of this area provides individual bars to the contacts in order to influence the current flow. In particular, mutual influencing of the electrical consumers among one another can be reduced in this way.

It goes without saying that the features mentioned above and those yet to be explained below can be used not only in the combination respectively indicated, but also in other combinations or by themselves, without departing from the scope of the present invention.

Figure 2:
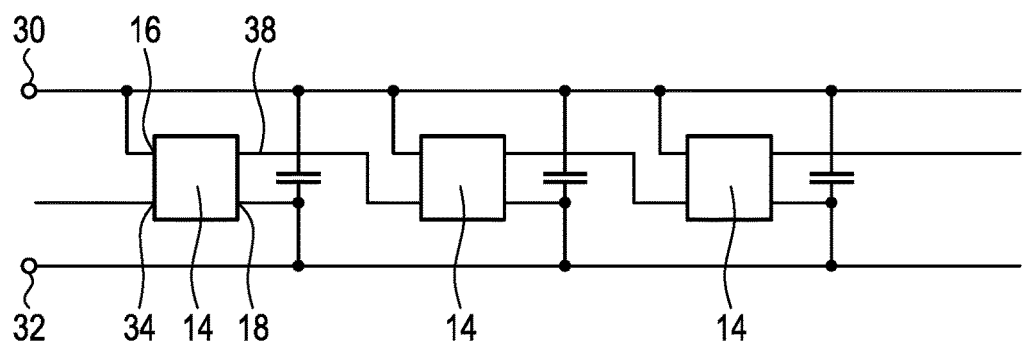
Figure 3:
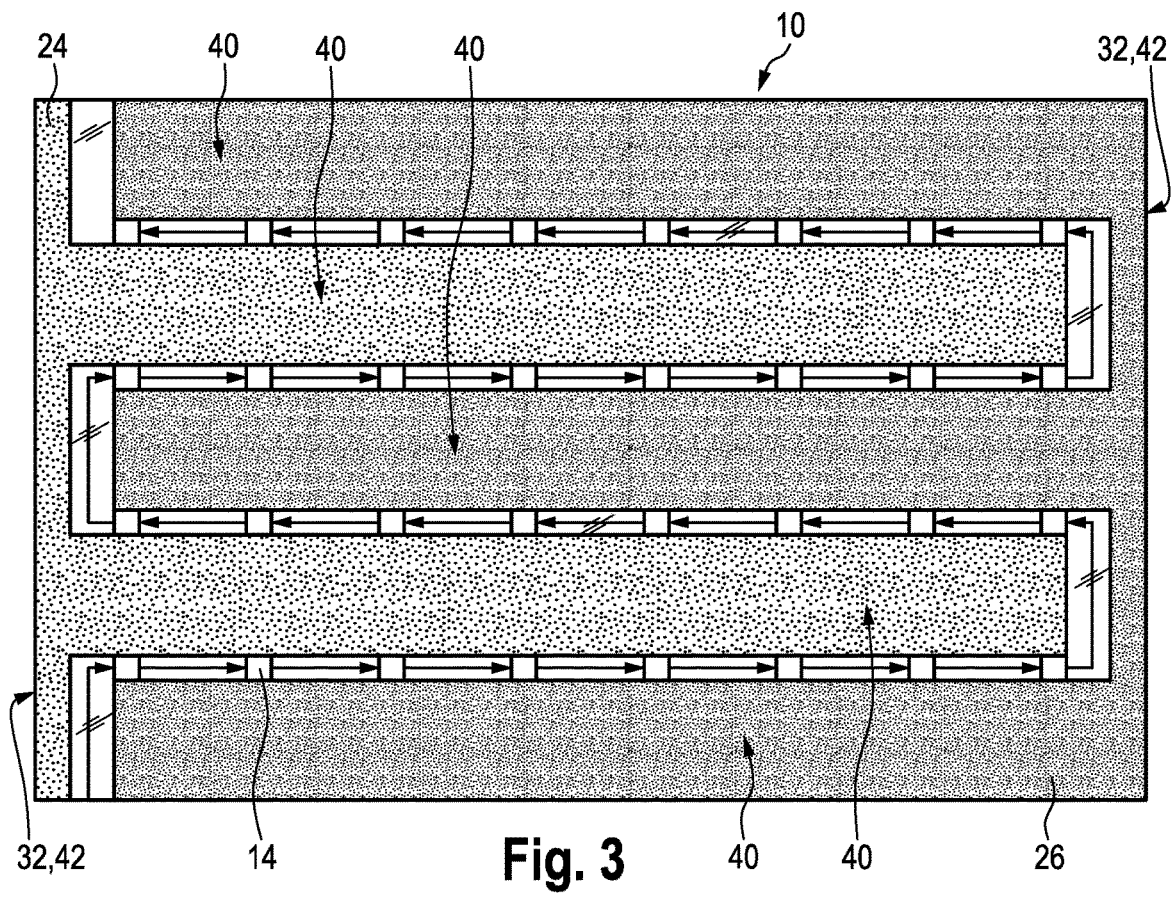
Figure 4:
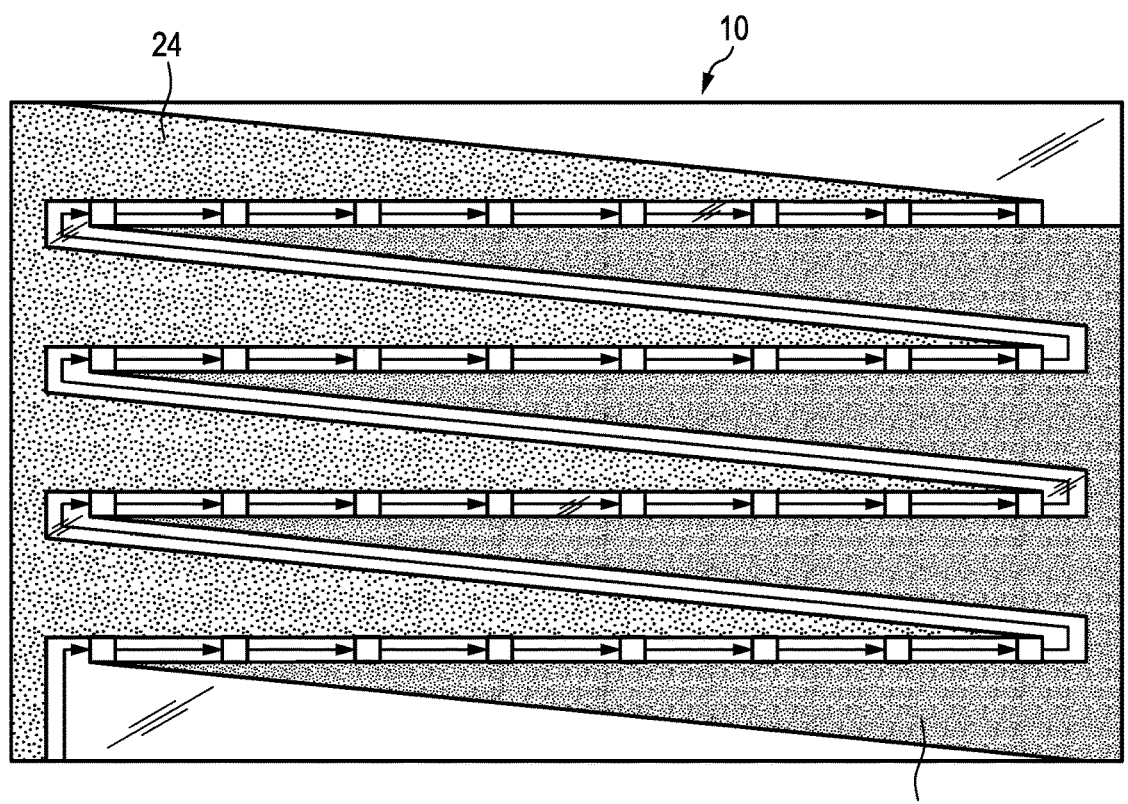
Figure 5:
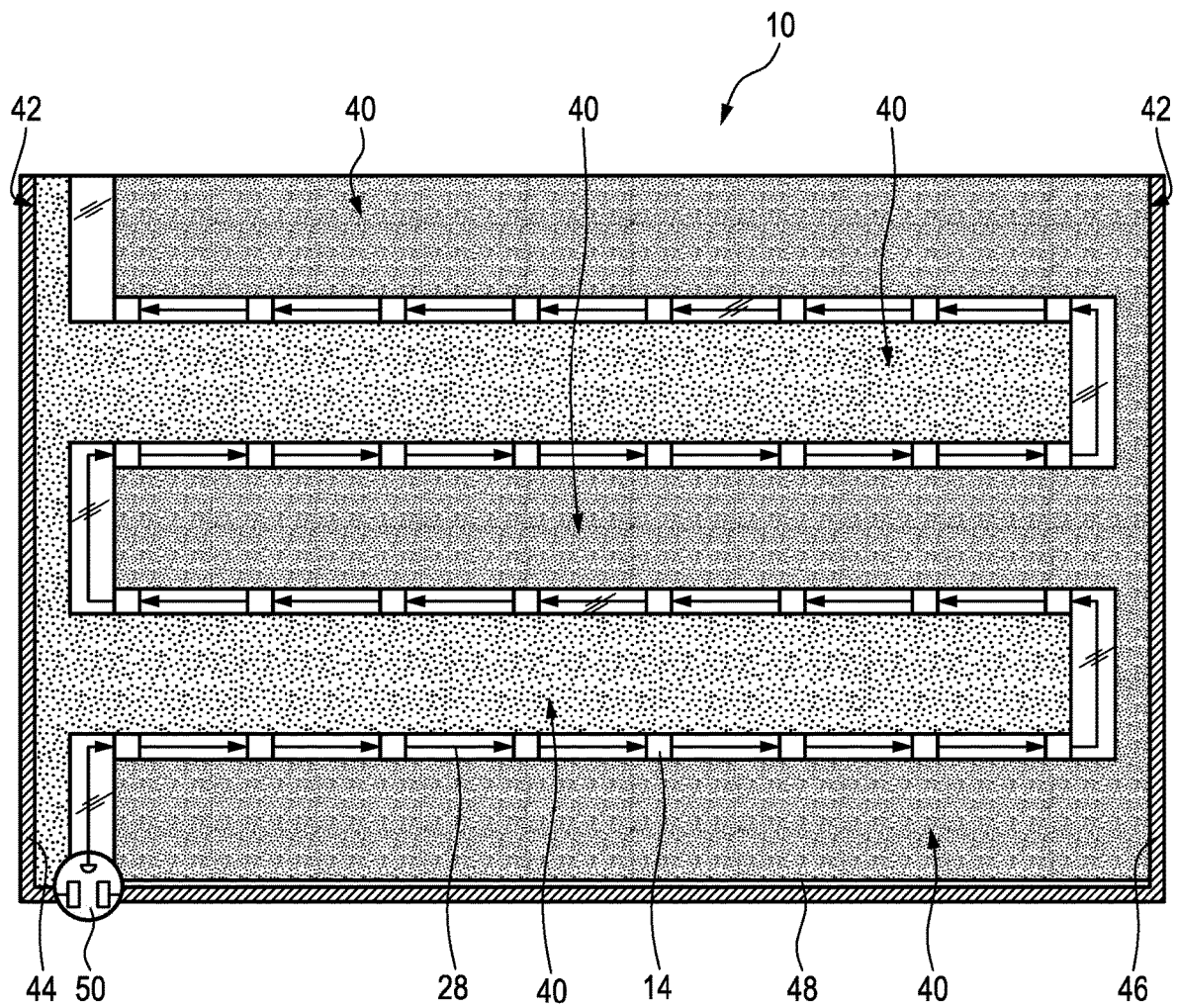
Figure 6:
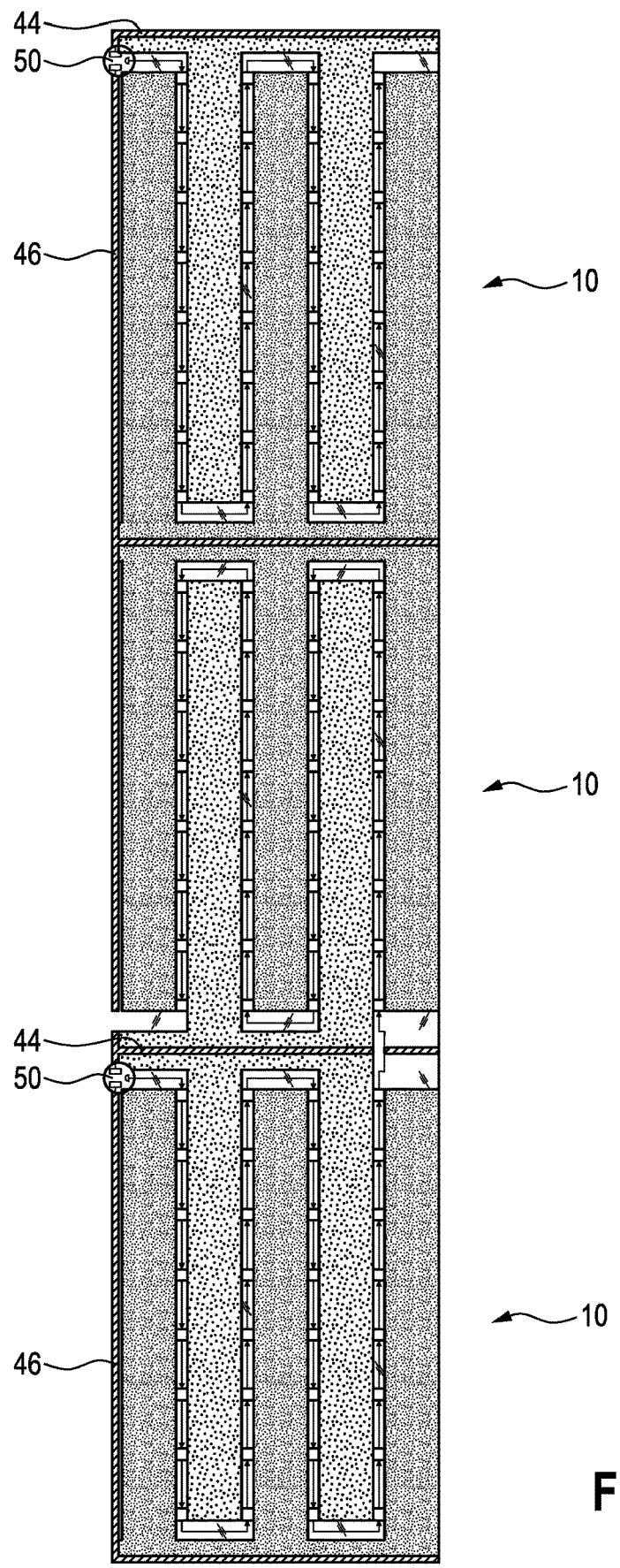
Figure 7:
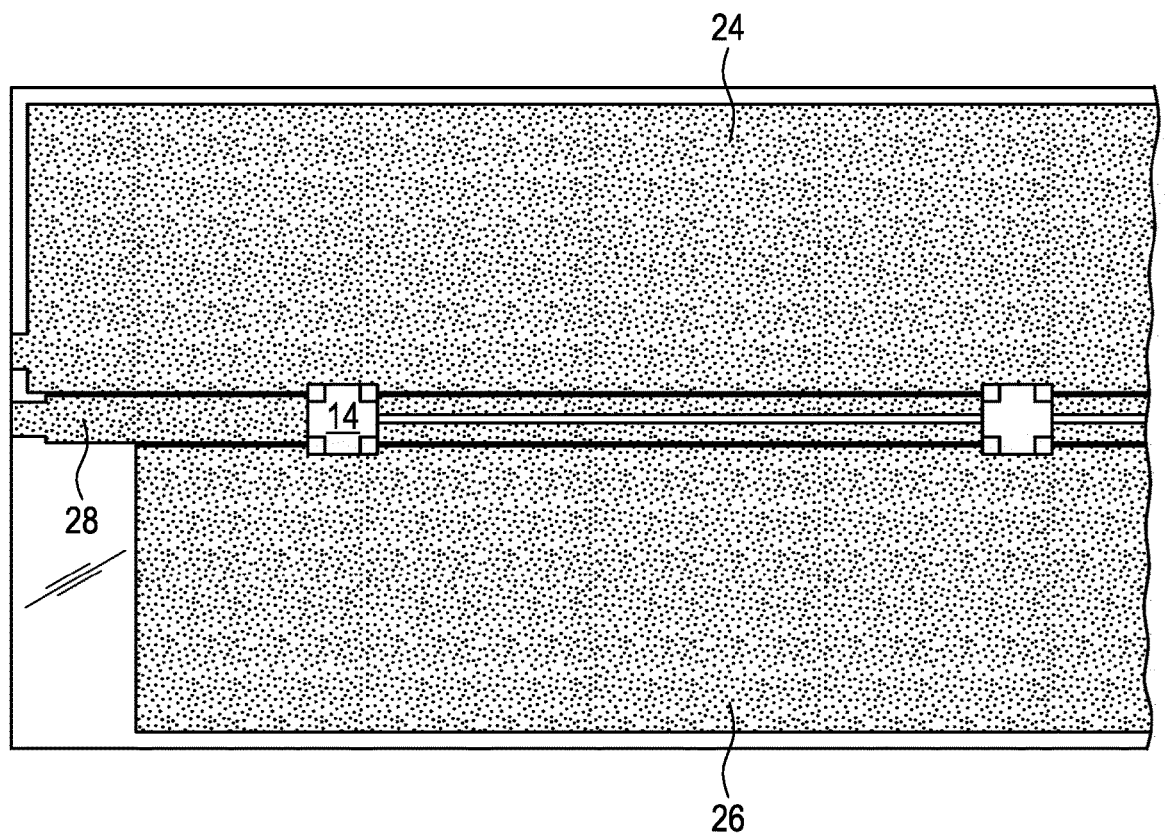
Figure 7:
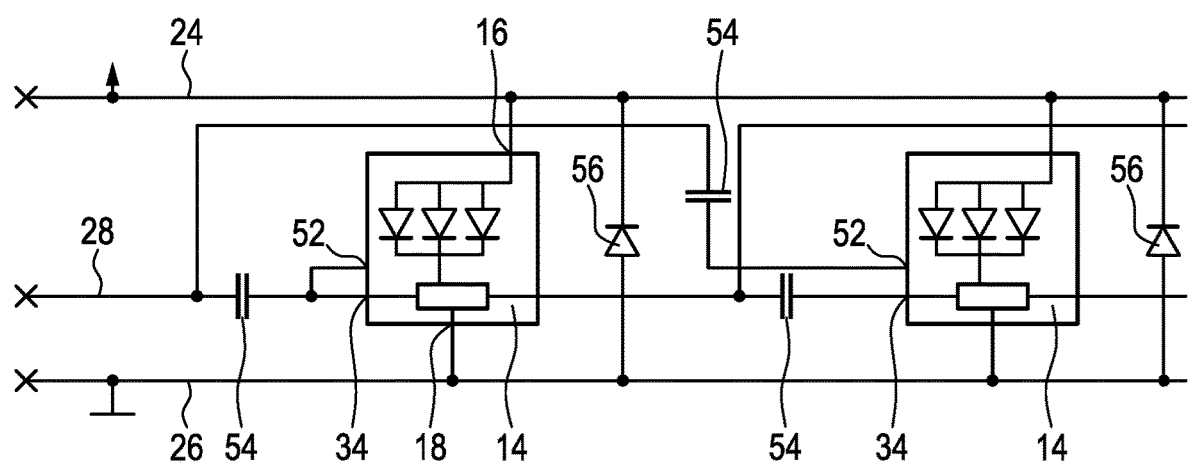
Figure 8:
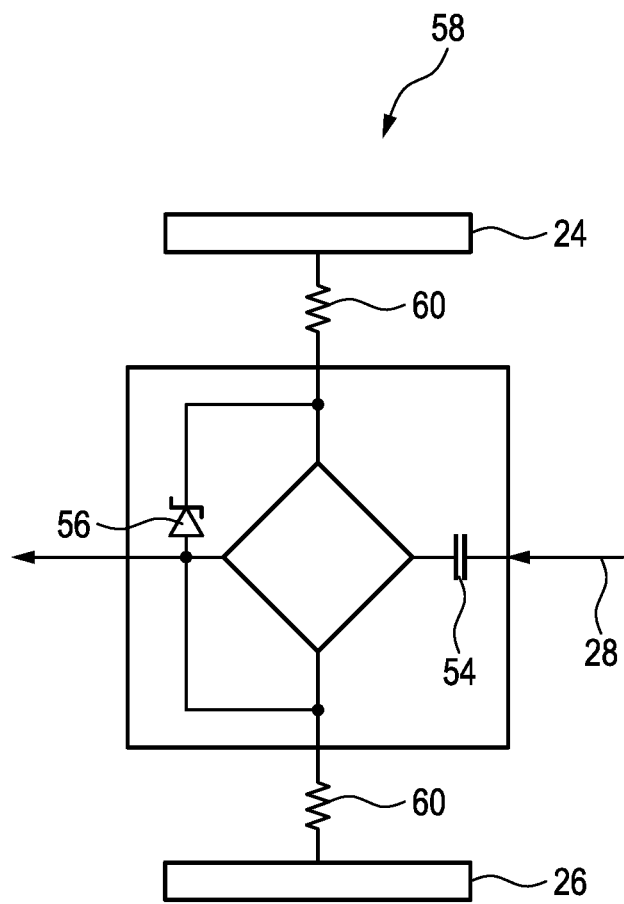
Figure 9:
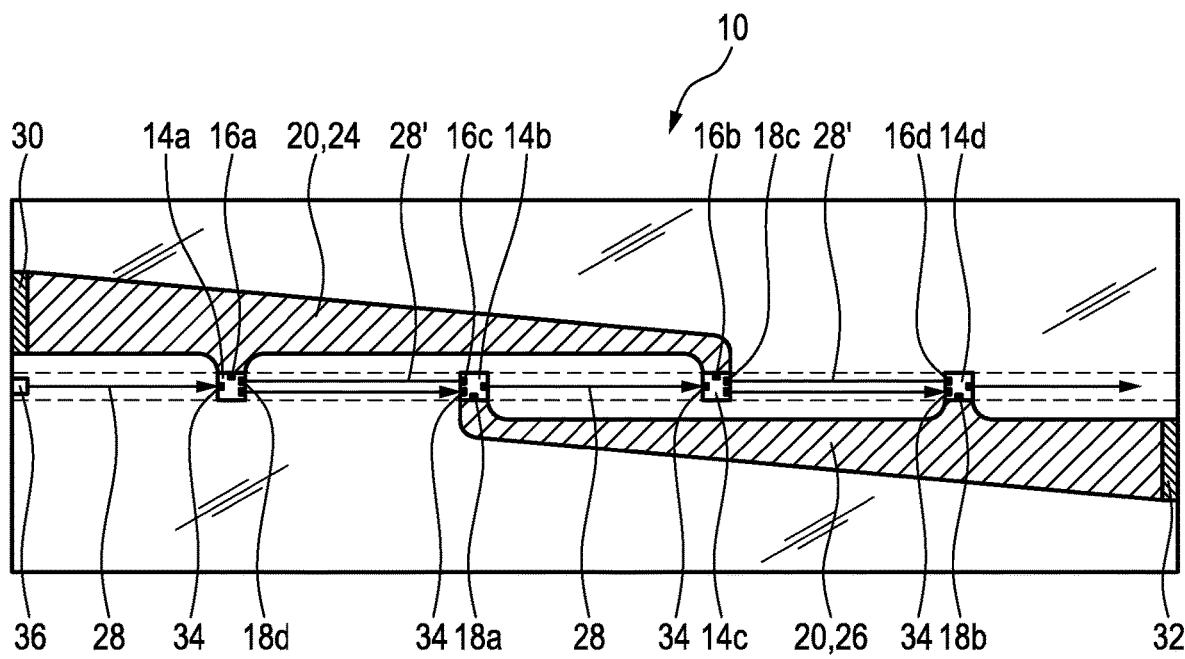
Figure 10:
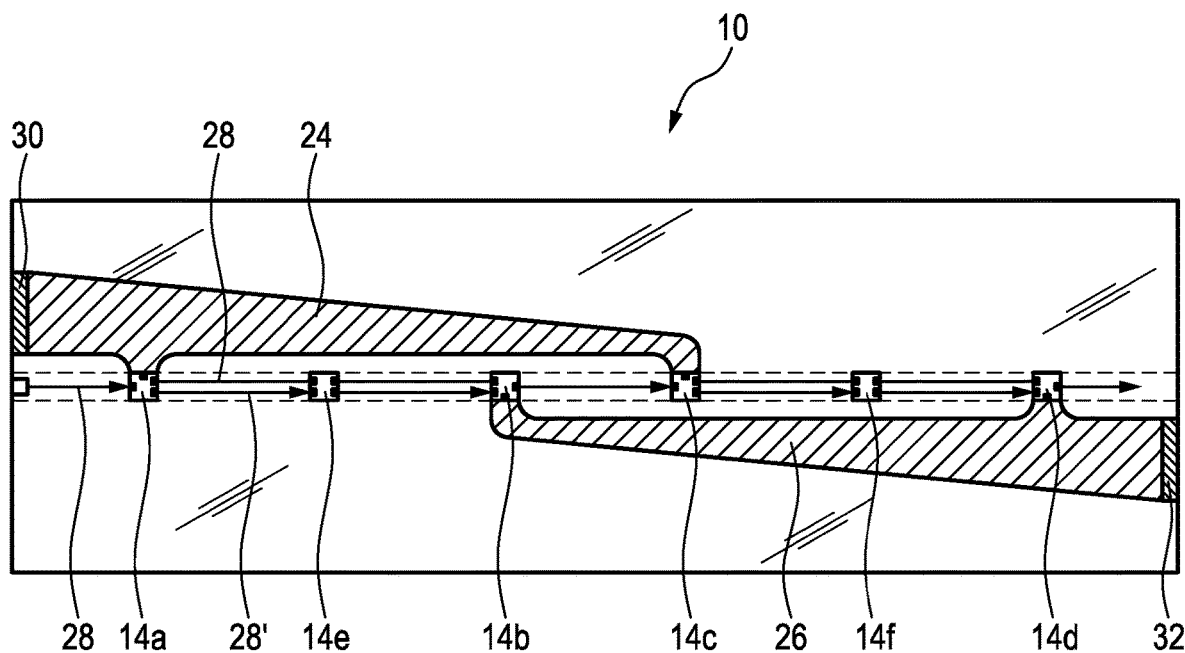

Exemplary embodiments of the invention are illustrated in the drawing and are explained in greater detail in the following description. In the figures:

FIG. 1: shows a schematic illustration of a display device in accordance with one exemplary embodiment of the present invention in a plan view, FIG. 2: shows a circuit diagram of a series of electrical consumers of one exemplary embodiment of the display device, FIG. 3: shows a schematic illustration of one preferred exemplary embodiment of the display device, FIG. 4: shows a schematic illustration of one particularly preferred exemplary embodiment of the display device, FIG. 5: shows a schematic illustration of one exemplary embodiment of the display device with a preferred connection technology, FIG. 6: shows a schematic illustration of one exemplary embodiment of a horizontally scaled display device in accordance with one embodiment of the present invention, FIG. 7: shows a schematic illustration of the circuitry of one exemplary realization of a display device in accordance with one embodiment of the present invention, FIG. 8: shows a circuit diagram of a smart LED as electrical consumer within the meaning of the present invention, FIG. 9: shows a schematic illustration of a display device in accordance with a further exemplary embodiment of the present invention in a plan view, and FIG. 10: shows a schematic illustration of a display device in accordance with the exemplary embodiment from FIG. 9 with in each case three consumers in a serial group.

In FIG. 1, one exemplary embodiment of the novel display device is designated in its entirety by the reference numeral 10. FIG. 1 shows a plan view of the display device 10. FIG. 2 analogously shows a schematic illustration of an electrical circuit in accordance with one embodiment of the invention. In this case, identical reference signs designate identical parts in the same way as with reference to FIG. 1 and are explained jointly below.

The display device 10 comprises an at least partly transparent substrate 12, in particular a glass pane or a laminated glass sheet. A plurality of electrical consumers 14 arranged in series are arranged on the transparent substrate 12. The electrical consumers 14 are preferably illuminants, in particular smart LEDs, which can display different colors. Preferably, the illuminants are individually drivable and configured to represent different colors or brightnesses depending on a control signal.

The electrical consumers 14 require a generally constant supply voltage. In the case of LEDs, said supply voltage is preferably provided by a constant current source. For applying the supply voltage to the electrical consumers 14, the latter have a first and a second contact 14, 16, which are each connected to a constant potential. The connection to the respective potential is effected via an electrically conductive and partly transparent layer 20.

Such a layer can be produced e.g. by means of a wet-chemical process and comprise e.g. systems composed of $ZnO$—$SnO_2$, $ZnO$—$In_2O_3$, $ZnO$—$Ga_2O_3$ and $Ga_2O_3$—$Sb_2O_5$, without the invention being restricted thereto. Partly transparent means, as explained above, that the layer is transparent at least to the extent of 50%.

The transparent and electrically conductive layer 20 is applied on a surface of the transparent substrate 12 on which the plurality of electrical consumers 14 are also arranged. The electrically conductive layer 20 acts like a copper coating of a printed circuit board and can be structured in a similar manner. Since the layer 20 is transparent, the display device 10 also remains transparent to the greatest possible extent. It goes without saying that besides the substrate and the electrically conductive layer, further layers can be present, e.g. a terminating cover layer, such that the electrical consumers are covered. The display device 10 can thus preferably be a laminated glass element comprising a plurality of layers.

In contrast to a copper coating, the sheet resistivity of the electrically conductive layer is approximately one hundred thousand times higher than the sheet resistance of a customary copper coating of a printed circuit board. Known connection techniques of smart LEDs by means of a nontransparent coating on a carrier material, such as, for example, in the case of a rigid or flexible printed circuit board with metal coating, cannot therefore readily be applied to a transparent and electrically conductive layer. As is explained in greater detail below, the transparent and electrically conductive layer has to be adapted accordingly for such an intended application.

In accordance with one embodiment of the invention, the transparent and electrically conductive coating 20 (hereinafter for short: coating) is specially structured and comprises a plurality of segments insulated from one another. The segments of the coating form a defined pattern 22 within the meaning of the claims.

The defined pattern 22 comprises at least three segments 24, 26, 28 insulated from one another. A first segment 24 electrically connects the first contacts 16 to a first terminal 30 for providing a first potential. A second segment 26 electrically connects the second contacts 18 to a second terminal 32 for providing a second potential. The first and second segments 24, 26 are substantially of identical size and, as explained in even greater detail below, realized symmetrically to the greatest possible extent.

A third segment 28 of the electrically conductive layer 20 serves for feeding a control signal to the electrical consumers 14. For this purpose, in this exemplary embodiment, the electrical consumers 14 each have a third contact 34 and the third segment 28 connects the third contacts 34 of the electrical consumers 14 to a third terminal 36 for providing a control signal.

In the exemplary embodiment illustrated here, the third segment 28 is embodied in the form of a conductor track and is smaller by a multiple in comparison with the first and second segments 24, 26. Since the control signal is preferably a digital signal, the line resistances are less relevant than in the case of an analog signal. Likewise, in contrast to the feed lines for the supply voltage, only low currents flow via the third segment 28. Therefore, a narrow track width is also suitable for the third segment 28.

In the exemplary embodiment illustrated in FIG. 1, the third segment 28 forms a conductor line, which connects the electrical consumers 14 preferably in series with one another. In one exemplary embodiment, an electrical consumer 14 can have a fourth contact. A control signal received via the third contact 16 can be output again via the fourth contact. In this case, the third segment 28 can be composed of a series of individual subsegments which are combined via the electrical consumers 14 and thus form the third segment 28.

The first and second segments 24, 26 serve for supplying the electrical consumers 14 with current. The current supply of the electrical consumers 14 via the coating 20 is subject to a voltage drop that is linear with respect to the passage of current. An electrical consumer 14 which is switched on naturally requires more current than an electrical consumer 14 which is switched off. Nevertheless, on account of the built-in electronics, a voltage level should be within a narrow range, e.g. between 3.5 and 5.3 V. For this purpose, a voltage regulator can be provided at the consumers 14, or integrated in the latter. Alternatively, a diode, in particular a zener diode, can also be connected between the first and second contacts 16, 18, which diode together with a feed line resistance provides for a stable voltage supply.

In principle, for a uniform voltage drop at the electrical consumers 14, a layout (defined pattern 22) of the coating has to be optimized accordingly on account of the high sheet resistivity of the coating.

If e.g. the electrical consumers 14, as shown in FIG. 1, are arranged horizontally in a series and one pole of the power supply is fed in from one side, and the other pole from the other side, then the pattern 22, in particular the first and second segments 24, 26, should be fashioned such that the voltage drop of "negative" and "positive" mutually compensate for one another. In the case of a defined pattern 22 in accordance with FIG. 1, e.g. the left electrical consumer 14 has a low voltage drop at the pole fed in from the left—but a high voltage drop at the pole fed in from the right. The opposite applies to the right electrical consumer 14. If a zener diode is then connected in parallel with the electrical consumer, it ensures that the local potential difference remains in a narrow range.

In order to be able to calculate the size of the voltage drop, it is advantageous to be able to calculate the sheet resistance for a given layout. Simulations can correspondingly be carried out for this purpose. Conversely, advantageous layouts can also be calculated by means of a simulation.

For the simulation, spatially direct connections between the contacts and the terminals of the potentials are considered and the sheet resistance is approximated e.g. on the basis on the length of the connections. It goes without saying that more complex simulations are conceivable in order to determine optimum connections and a layout required therefor.

In preferred configurations, the electrical consumers 14 are arranged on the transparent substrate not only in the horizontal direction but also in the vertical direction in the form of a two-dimensional matrix. Particularly preferably, in this case, the conductor line formed from the third segment 28 drives not only electrical consumers 14 of one series, but also electrical consumers 14 of further series. Corresponding embodiments are illustrated in FIG. 3 and FIG. 4.

In the preferred exemplary embodiments in accordance with FIG. 3 and FIG. 4, the outer shape of the display device 10 is a rectangle over which the electrical consumers 14 are distributed in uniform rows and columns. It goes without saying that the invention is not restricted to this outer shape and such a distribution and further shapes and distributions are conceivable.

The first and second segments 24, 26 here are embodied like two comblike structures, the teeth 40 of which intermesh without touching one another. The electrical consumers 14 run along the teeth 40 at least on one side. The terminals 30 and 32 are arranged at the comb spine 42, which here extends in each case along a side edge of the outer contour.

The zigzag embodiment of the combs as shown in FIG. 4 has proved to be particularly advantageous since here the electrical consumers 14 in the center of a row can also be supplied with a constant voltage, as explained above with reference to FIG. 1.

In order to be able to drive a relatively large display device with a large number of electrical consumers 14, a large amount of energy is required. In the case of punctiform feed line terminals, in this case exponentially more energy would be lost at the feed line resistances of the coating. Therefore, in preferred exemplary embodiments, the transparent substrate 12 is provided with additional metal conductors at the edges in order to improve the energy feed.

FIG. 5 shows a corresponding exemplary embodiment in which two mutually opposite sides are provided with a respective metal electrode 44, 46. The metal electrodes 44, 46 run along the comb spines 42 and provide for an optimum and uniform energy feed to the individual teeth 40 and thus to the electrical consumers 14. Since the nontransparent metal electrodes 44, 46 are situated at the edge of the transparent substrate 12 in this configuration, the transparency is hardly impaired since a transparent substrate is regularly transparent only to a limited extent at the edge.

In one particularly preferred configuration, one of the metal electrodes 46 can also extend along one of the adjacent sides of the two opposite sides. As illustrated in FIG. 5, the metal electrode 46 at this side is preferably not connected to the electrically conductive layer, however, but rather is separated from the latter by a gap 48, in order that possible zener diodes at the electrical consumers 14 are not overloaded as a result of an excessively low feed line resistance.

Bringing the two metal electrodes 44, 46 together at a common terminal location 50 enables the display device 10 to be connected to controlling and energy-providing electronics (not illustrated here) in a particularly simple manner. Particularly preferably, the conductor line, that is to say the third segment 28, is additionally also led out at the terminal location 50.

Since the supply voltage and thus the power loss rise exponentially with the number of electrical consumers 14 in a row, the horizontal resolution of the display device 10 cannot be increased arbitrarily. Even a matrix having 36×36 smart LEDs as electrical consumers 14 requires a supply voltage of approximately 230 V.

In order nevertheless to be able to provide a wider display device, a plurality of the transparent substrates according to the invention can be arranged next to one another. Preferably, for this purpose, the layout in accordance with the embodiment according to FIG. 5 is mirrored on the laterally following substrate. The lateral metal electrodes 44, 46 then do not touch one another. Advantageously, in this context, the conductor line can also be relayed from one transparent substrate 12 to the transparent substrate situated next to the latter. Additional plug connections can possibly be dispensed with in this way.

One exemplary embodiment of a horizontally scaled display device 10 is shown in FIG. 6. Identical reference signs designate identical parts and are not explained again hereinafter.

Vertical scaling of the display device 10 does not pose a problem with regard to the supply voltage, although the reliability may be limited since, in the case of a serial conductor line, the failure of an electrical consumer can influence all electrical consumers following the latter. Therefore, there are electrical consumers, e.g. the smart LED of the WS2813 type, which have a further contact for receiving a control signal, which further contact is taken into consideration in the case where no control signal arrives at the third contact.

FIG. 7 shows a corresponding exemplary embodiment in which the electrical consumers 14 each have a further contact 52 for receiving a control signal. Via this "backup" input, the data signal of the penultimate consumer can be fed to the respective consumer. If the last consumer fails and no longer supplies data to the normal input (here contact 34) of the subsequent consumer, the subsequent consumer takes the "backup" input of the penultimate consumer as input. Furthermore, it is possible to use the data line realized via the further contacts 52 at the consumers as a return channel in order to transmit feedback from the consumers or to realize a bidirectional, circular transmission. For the rest, the driving is as illustrated in FIG. 1.

In the exemplary embodiment in accordance with FIG. 7, a capacitor 54 is additionally arranged in each of the serial feed lines to the third contact 34 and respectively to the further contact 52. Besides this coupling capacitor 52, an additional, external resistor can furthermore also be provided in order to realize a complete CR filter. In addition, a respective diode 56 having the above-described function as a voltage regulator can be arranged between the first contact 16 and second contact 18, as shown here.

FIG. 8 shows, finally, a preferred electrical consumer in a schematic diagram. The electrical consumer here is a smart LED 58 that is supplied with a voltage via the first and second segments 24, 26.

On account of different feed line resistances 60 of the voltage supply, which result substantially from the sheet resistances of the first and second segments 24, 26, smart LEDs 58 connected via the first and second segments 24, 26 do not all operate at the same voltage potential. This is relevant primarily to the signal powers connecting the smart LEDs to one another. A local level of 0 V at a first smart LED is not necessarily the same local level that is then present at an adjacent smart LED. Rather, the value can be larger or smaller on account of the different ground potential at the adjacent smart LED.

In order to avoid this problem, it is advantageous to integrate a respective capacitor 54 into the signal path. The capacitor 54 helps to eliminate potential differences by virtue of the capacitor 54 passing through only the regularly changing voltage differences of the signal. It should be taken into consideration, however, that the serial signals should not have DC components in this case, since only AC components can be taken into account. Advantageously, the control signal should have a correspondingly high frequency in order not to be corrupted by the RC element. The modulation of the serial signals should therefore preferably be chosen specifically and can be e.g. a Manchester coding.

The advantage of a zener diode 56 vis à vis a voltage regulator is also manifested in this context. With the use of a voltage regulator, the ground potentials of the smart LED would change dynamically when the smart LEDs switch on and off. This would result in corruptions for the serial signal. In the case of a zener diode 56, however, the total energy consumption remains approximately the same and thus the ground potentials do not change either.

If the electrical consumers 14 are driven via a common feed line (first and second segments), it can happen that the high current consumption of an electrical consumer also influences the function of the adjacent electrical consumer. In the case of smart LEDs, e.g. the luminosity of an adjacent smart LED could be influenced, i.e. the increased voltage drop at a smart LED reduces the luminous intensity of an adjacent smart LED.

In order to avoid this, it is conceivable to lead separate spur lines to the individual electrical consumers, instead of the common feed line. Alternatively, the voltage drop at the adjacent consumers can also be foreseen mathematically and compensated for by software technology. For example by adapting the brightness values in the case of smart LEDs. Furthermore, it is conceivable, if the electrical consumers are driven with time division multiplexing, to offset the temporal driving, such that the maximum current flow is reduced. In the case of smart LEDs, if the luminous emission of two smart LEDs is intended to be gray, for example, it is possible to allow one smart LED to emit light for 50% of the time, and the other smart LED for 50% of the time. A loss of voltage through the feed line would thus remain low since the maximum current flow would be reduced by approximately half.

FIG. 9 shows a schematic illustration of a display device in accordance with a further exemplary embodiment of the present invention in a plan view.

Here, too, the display device 10 comprises an at least partly transparent substrate 12, on which a plurality of electrical consumers 14 (here four items 14a, 14b, 14c, 14d) arranged in series are arranged. The electrical consumers 14 are arranged in a manner similar to that as described above with regard to the other exemplary embodiments.

The electrical consumers 14, as illustrated here, can be serially connected in series, that is to say that e.g. a second contact 18d of a first consumer 14a is connected to a first contact 16a of a second consumer 14b, wherein the first contact 16a of the first consumer 14a is in contact with the first segment 24 and the second contact 18a of the second consumer 14b is in contact with the second segment 26.

The serial connection between the first and second consumers 14a, 14b can be effected in the third segment 28. For this purpose, the third segment 28 can comprise between the consumers a further segment 28', which realizes the serial connection. In other words, the segment can be divided between the consumers into at least two sections which are separated from one another and insulated from one another and which electrically connect different contacts between the consumers like conductor tracks.

Preferably, the parallel and serial connection techniques can be combined with one another, as illustrated in FIG. 9. Here the first consumer 14a and the second consumer 14b form a first group, within which the first and second consumers, as described above, are connected in series with one another. A third consumer 14c and a fourth consumer 14d form a second group, within which the third and fourth consumers are connected in series with one another. The first and second groups are in turn connected to the first and second terminals 30, 32 in parallel with one another via the first and second segments 24, 26.

If the current supply of the consumers, as illustrated here, is partly serially connected in series, the current losses can be significantly reduced since higher voltages and, associated therewith, lower currents can be employed.

It goes without saying that the invention is not restricted to the configuration with two groups shown here, rather that a multiplicity of such groups can be formed in a series.

Likewise, the number of consumers within a group is not restricted to the number illustrated here. As explained below with reference to FIG. 10, the group can also comprise more than two consumers. In particular, a group can also comprise consumers which are in contact only with the respective preceding and succeeding consumers in the series and are electrically connected neither to the first segment 24 nor to the second segment 26.

FIG. 10 shows, e.g. the exemplary embodiment in accordance with FIG. 9 with in each case three consumers in a group. A first serial group here is formed by the consumers 14a, 14b and 14e and a second serial group is formed by the consumers 14c, 14d and 14f. From each group, a consumer 14a, 14c is connected to the first segment 12 and a consumer 14b, 14d is connected to the second segment 26. By contrast, the consumers 14e and 14f are connected to neither of the two segments.

The structuring of the first and second segments 24, 26 can nevertheless be effected like the structuring of the first and second segments 24, 26 in accordance with the exemplary embodiment in FIG. 1, i.e. a pattern can be chosen such that the resulting segments are approximately of identical size and preferably symmetrical, such that a voltage drop at the segments from the connected potentials to the first and second groups is in each case of identical size.

The invention claimed is:

1. A display device, comprising:
an at least partially transparent substrate,
a plurality of electrical consumers arranged in series, wherein each consumer has a first contact and a second contact for applying a first potential and a second potential and a third contact for receiving a control signal,
a partly transparent, electrically conductive layer for electrically contacting the plurality of electrical consumers,
a first terminal and a second terminal for applying the first and second potentials to the electrically conductive layer and also a third terminal for applying the control signal to the electrically conductive layer,
wherein the electrically conductive layer is applied in a defined pattern to the at least partly transparent substrate, which has at least three segments insulated from one another,
wherein a first segment and a second segment are spaced apart from one another by a third segment,
wherein the first segment contacts the first terminal and the first contact of one or more consumers of the plurality of consumers, the second segment contacts the second terminal and the second contact of one or more consumers of the plurality of electrical consumers, and the third segment contacts at least the third contact of an electrical consumer of the plurality of electrical consumers,
wherein the first segment contacts the first terminal and the first contact of at least two consumers of the plurality of consumers and the second segment contacts the second terminal and the second contact of at least two further consumers of the plurality of electrical consumers, wherein in each case a first consumer of the at least two consumers and a first consumer of the at least two further consumers define a first group, within which the first consumers are connected in series, and wherein a second consumer of the at least two consumers and a second consumer of the at least two further consumers define a second group, within which the second consumers are connected in series, and
wherein the third segment between the plurality of consumers is subdivided into a further segment and a series connection of the first consumers and the second consumers is formed via the further segment.

2. The display device as claimed in claim 1, wherein the first and second segments substantially comprise an area of identical size and are embodied symmetrically.

3. The display device as claimed in claim 1, wherein the first group has a further third consumer, which is connected in series with the first consumers of the first group, and wherein the second group has a further third consumer, which is connected in series with the second consumers of the second group.

4. The display device as claimed in claim 1, wherein the first segment contacts the first terminal and the first contact of all consumers of the plurality of consumers and the second segment contacts the second terminal and the second contact of all consumers of the plurality of electrical consumers.

5. The display device as claimed in claim 4, wherein the first segment comprises for each electrical consumer in each case an electrically conductive first connection of the respective first contact to the first potential and the second segment comprises for each electrical consumer in each case an electrically conductive second connection of the respective second contact to the second potential, wherein each of the first and second electrically conductive connections has in each case a defined sheet resistance relative to the electrically conductive layer, and wherein the defined pattern is embodied such that a ratio of the sheet resistances of the respective first and second connections of each electrical consumer is of identical magnitude in a defined tolerance range for the plurality of electrical consumers arranged in series.

6. The display device as claimed in claim 1, wherein the third segment forms a conductor line, which connects the electrical consumers of the plurality of electrical consumers in series with one another.

7. The display device as claimed in claim 6, wherein the third segment is divided into a plurality of segments and the electrical consumers of the plurality of electrical consumers are configured to modify the control signal in each case.

8. The display device as claimed in claim 6, wherein the conductor line has at least one capacitor in series and optionally a resistor.

9. The display device as claimed in claim 1, wherein a respective voltage regulator is arranged between the first contact and the second contact of the plurality of consumers.

10. The display device as claimed in claim 9, wherein the voltage regulator is a zener diode, which is connected in parallel with the first and second contacts.

11. The display device as claimed in claim 1, wherein the transparent substrate is rectangular and the first terminal for applying the first potential extends along a first side of the at least partly transparent substrate and the second terminal for applying the second potential extends along a second side situated opposite the first side.

12. The display device as claimed in claim 11, wherein the series of the plurality of electrical consumers extends from the first side toward the second side and the series defines in particular a straight line that intersects the first and second sides at a right angle.

13. The display device as claimed in claim 1, wherein the first segment forms a first closed, triangular area and the second segment forms a second closed, triangular area.

14. The display device as claimed in claim 13, wherein a first side of the first closed, triangular area runs along a side of the at least partly transparent substrate, a first side of the second closed, triangular area runs along a second side of the at least partly transparent substrate, said second side being situated opposite the first side, and a second side of the first and second closed, triangular areas in each case runs along the series of the plurality of electrical consumers.

15. The display device as claimed in claim 1, wherein at least one electrical consumer of the plurality of electrical consumers is a smart LED.

16. The display device as claimed in claim 1, wherein each consumer of the plurality of electrical consumers has a fourth contact and is configured to loop the control signal through serially from the third contact to the fourth contact.

17. The display device as claimed in claim 1, wherein the first and second segments are embodied as a plurality of spur lines to the first and second contacts of the plurality of electrical consumers.

18. A display device, comprising:
an at least partially transparent substrate,
a plurality of electrical consumers arranged in series, wherein each consumer has a first contact and a second contact for applying a first potential and a second potential and a third contact for receiving a control signal, a partly transparent, electrically conductive layer for electrically contacting the plurality of electrical consumers, a first terminal and a second terminal for applying the first and second potentials to the electrically conductive layer and also a third terminal for applying the control signal to the electrically conductive layer, wherein the electrically conductive layer is applied in a defined pattern to the at least partly transparent substrate, which has at least three segments insulated from one another, wherein a first segment and a second segment are spaced apart from one another by a third segment, wherein the first segment contacts the first terminal and the first contact of one or more consumers of the plurality of consumers, the second segment contacts the second terminal and the second contact of one or more consumers of the plurality of electrical consumers, and the third segment contacts at least the third contact of an electrical consumer of the plurality of electrical consumers, wherein the third segment forms a conductor line, which connects the electrical consumers of the plurality of electrical consumers preferably in series with one another, and wherein at least one of:
(i) the conductor line has at least one capacitor in series and optionally a resistor;
(ii) the third segment is divided into a plurality of segments and the electrical consumers of the plurality of electrical consumers are configured to modify the control signal in each case.

19. A display device, comprising:
an at least partially transparent substrate,
a plurality of electrical consumers arranged in series, wherein each consumer has a first contact and a second contact for applying a first potential and a second potential and a third contact for receiving a control signal, a partly transparent, electrically conductive layer for electrically contacting the plurality of electrical consumers, a first terminal and a second terminal for applying the first and second potentials to the electrically conductive layer and also a third terminal for applying the control signal to the electrically conductive layer, wherein the electrically conductive layer is applied in a defined pattern to the at least partly transparent substrate, which has at least three segments insulated from one another, wherein a first segment and a second segment are spaced apart from one another by a third segment, wherein the first segment contacts the first terminal and the first contact of one or more consumers of the plurality of consumers, the second segment contacts the second terminal and the second contact of one or more consumers of the plurality of electrical consumers, and the third segment contacts at least the third contact of an electrical consumer of the plurality of electrical consumers, and wherein at least one of:
(i) each consumer of the plurality of electrical consumers has a fourth contact and is configured to loop the control signal through serially from the third contact to the fourth contact;
(ii) the first and second segments are embodied as a plurality of spur lines to the first and second contacts of the plurality of electrical consumers.

* * * * *